United States Patent
Nakano et al.

(10) Patent No.: US 7,196,456 B2
(45) Date of Patent: Mar. 27, 2007

(54) PIEZOELECTRIC ACTUATOR AND METHOD OF MANUFACTURE THEREFOR, AND INK JET HEAD AND INK JET TYPE RECORDING DEVICE

(75) Inventors: Takanori Nakano, Osaka (JP); Masakazu Tanahashi, Osaka (JP); Kazuo Nishimura, Osaka (JP); Masaichiro Tatekawa, Osaka (JP); Shogo Matsubara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 11/150,576

(22) Filed: Jun. 10, 2005

(65) Prior Publication Data
US 2005/0225209 A1  Oct. 13, 2005

Related U.S. Application Data

(62) Division of application No. 10/462,357, filed on Jun. 16, 2003, now Pat. No. 6,921,157.

(30) Foreign Application Priority Data
Jun. 21, 2002  (JP) .............................. 2002-181402

(51) Int. Cl.
  *H01L 41/08*  (2006.01)
(52) U.S. Cl. ....................... 310/341; 310/344
(58) Field of Classification Search ............... 310/328, 310/330–332, 340–344
See application file for complete search history.

(56) References Cited

U.S. PATENT DOCUMENTS

| | | | |
|---|---|---|---|
| 2,656,473 A * | 10/1953 | Warner, Jr. ................. | 310/312 |
| 5,754,205 A | 5/1998 | Miyata et al. | |
| 6,098,460 A * | 8/2000 | Otsuchi et al. .......... | 73/514.34 |
| 6,109,736 A | 8/2000 | Miyata et al. | |
| 6,332,672 B1 | 12/2001 | Yazaki et al. | |
| 6,688,731 B1 | 2/2004 | Fujii et al. | |
| 6,788,724 B1 * | 9/2004 | Sell et al. ..................... | 372/92 |

FOREIGN PATENT DOCUMENTS

| JP | 2754407 | 5/1998 |
|---|---|---|
| JP | 11-235823 A | 8/1999 |

* cited by examiner

*Primary Examiner*—Mark Budd
(74) *Attorney, Agent, or Firm*—Harness, Dickey & Pierce, P.L.C.

(57) ABSTRACT

A piezoelectric actuator 21 has: a piezoelectric actuator part 22 made up of a common electrode 27, a piezoelectric element 29, and an individual electrode 33; an electrical interconnection joint part 43 formed on the individual electrode 33; an electrical interconnection 45 formed on the electrical interconnection joint part 43; a head block 47 fixed to a nozzle plate 39 through the electrical interconnection 45; and a PI tape 49 disposed within the head block 47. A closed space 57 is defined between the head block 47 and the nozzle plate 39. The closed space 57 is divided by the PI tape 49 into two sections. Of these two sections of the closed space 57, the one on the side of the head block 47 constitutes a first closed space 57a. A moisture absorbent 52 is sealed within the first closed space 57a. Relative humidity within the closed space 57 of the ink jet head 1 is not less than 0% nor more than 20%.

8 Claims, 9 Drawing Sheets

PIEZOELECTRIC ACTUATOR AND METHOD OF MANUFACTURE THEREFOR, AND INK JET HEAD AND INK JET TYPE RECORDING DEVICE

CROSS-REFERENCE TO RELATED APPLICATIONS

This application is a divisional of U.S. patent application Ser. No. 10/462,357 filed on Jun. 16, 2003 now U.S. Pat. No. 6,921,157. This application also claims the benefit of Japanese Patent Application Nos. 2002-181402 filed Jun. 21, 2002. The disclosure(s) of the above application(s) are incorporated herein by reference.

TECHNICAL FIELD

The present invention relates to piezoelectric actuators and methods of manufacture therefor, and to ink jet heads and ink jet type recording devices.

BACKGROUND ART

Ink jet heads cable of effecting recording by making utilization of the piezoelectric effect of piezoelectric elements have been known in the prior art.

A typical ink jet head of such a type has a piezoelectric actuator formed by laminating together a common electrode, a piezoelectric element, and an individual electrode in sequence, and an ink flow path substrate in which is formed a pressure chamber. Mounted on one surface of the piezoelectric actuator is a vibrating plate. The vibrating plate is bonded onto an ink flow path formation substrate with an adhesive agent. And, during the emission of ink, voltage is impressed on the common electrode and on the individual electrode, as a result of which the piezoelectric element undergoes expansion and contraction. The vibrating plate restricts the expansion and contraction of the piezoelectric element. Consequently, the piezoelectric actuator undergoes bending and deformation in the lamination direction. The volume of the pressure chamber is varied by the bending and deformation of the piezoelectric actuator, and ink in the pressure chamber is shot through a nozzle.

Incidentally, piezoelectric elements are formed of insulating material. Therefore, it is undesirable for the ink jet head to be left in humid circumstances for the following reasons. A typical piezoelectric element is prepared by a film forming technique such as sputtering or the like. This, however, may give rise to a void and/or a pinhole within the piezoelectric element in the course of such film preparation. Voids are likely to be produced by the abnormal growth of a piezoelectric element caused by contaminants adhering onto an ink flow path substrate. On the other hand, pinholes are likely to be produced when a piezoelectric element is sputtered onto an ink flow path formation substrate. And, if moisture enters a void or a pinhole, this results in increased leak current when voltage is impressed between both the electrodes. Therefore, there is the possibility of occurrence of dielectric breakdown.

With a view to eliminating the above-mentioned harmful effects, Japanese Patent Kokai Gazette No. (1999)235823 proposes an ink jet head provided with a cap for enclosing a piezoelectric element which is joined onto an ink flow path formation substrate, thereby making it possible to prevent water vapor from entering the space within the cap. Consequently, entrance of water vapor into a void or a pinhole of the piezoelectric element is prevented, and it can be expected that dielectric breakdown due to moisture will be prevented from occurring.

The above-described ink jet head construction is provided with a cap capable of enclosing a piezoelectric actuator. However, it does not provide any means for absorbing moisture within the cap, therefore making it difficult to maintain the space within the cap at low humidity levels. Consequently, there is still the possibility of occurrence of dielectric breakdown in the above-described prior art ink jet head.

In order to eliminate the above-mentioned harmful effects, Japanese Patent Publication No. 2754407 proposes a piezoelectric actuator provided with a moisture absorbing part having a moisture absorbing action. This moisture absorbing part is disposed in the vicinity of a piezoelectric element. Therefore, ambient humidity around the piezoelectric element is lowered by the moisture absorbing action of the moisture absorbing part, and it can be expected that dielectric breakdown due to moisture will be prevented from occurring.

The above-described piezoelectric actuator construction includes a moisture absorbing part in the vicinity of a piezoelectric element. However, it does not provide any means for isolating the piezoelectric actuator itself from moisture-containing outside air. In addition, the foregoing patent publication fails to provide any means for coping with problems arising when the moisture absorption action of the moisture absorption part becomes deteriorated. Therefore, it is difficult for the above-described piezoelectric actuator to maintain ambient humidity around the piezoelectric element at low levels. Therefore, there is the possibility of occurrence of dielectric breakdown.

Bearing in mind the foregoing drawbacks with the prior art techniques, the present invention was made. Accordingly, an object of the present invention is to prevent dielectric breakdown due to moisture from occurring in a piezoelectric actuator by specifying relative humidity around the piezoelectric actuator, the performance of a moisture absorbent, or the performance of a cap member enclosing the piezoelectric actuator.

DISCLOSURE OF INVENTION

A first invention is a piezoelectric actuator comprising: a piezoelectric actuator main body having a bottom electrode, a piezoelectric element formed on the bottom electrode, and a top electrode, formed on the piezoelectric element, for impressing voltage on the piezoelectric element together with the bottom electrode; and a humidity control device for maintaining, at the time of such voltage impression, ambient relative humidity around the piezoelectric actuator main body at not less than 0% nor more than 20% in a measurement environment of 60° C. and 1 atm.

Such arrangement further ensures that dielectric breakdown due to moisture is prevented from occurring.

A second invention is a piezoelectric actuator comprising: a piezoelectric actuator main body having a bottom electrode, a piezoelectric element formed on the bottom electrode, and a top electrode, formed on the piezoelectric element, for impressing voltage on the piezoelectric element together with the bottom electrode; a cap member for enclosing at least a surface of the piezoelectric actuator main body on the side of the top electrode; and a moisture absorbent disposed in a closed space between the piezoelectric actuator main body and the cap member and having an ability to absorb moisture, wherein ambient relative humidity within the closed space is not less than 0% nor more than 20% in a measurement environment of 60° C. and 1 atm.

As a result of such arrangement, ambient relative humidity around the piezoelectric actuator main body is maintained at not less than 0% nor more than 20% in a measurement environment of 60° C. and 1 atm, whereby dielectric breakdown due to moisture is prevented from occurring.

A third invention is a piezoelectric actuator comprising: a piezoelectric actuator main body having a bottom electrode, a piezoelectric element formed on the bottom electrode, and a top electrode, formed on the piezoelectric element, for impressing voltage on the piezoelectric element together with the bottom electrode; a cap member for enclosing at least a surface of the piezoelectric actuator main body on the side of the top electrode; and a moisture absorbent disposed in a closed space between the piezoelectric actuator main body and the cap member and having, as an indication of the efficiency of absorbing moisture, a coefficient of moisture absorption of not less than 5 wt. % in a measurement environment of 25° C., 1 atm, and 80% relative humidity, wherein the amount of moisture absorbed into the moisture absorbent is not less than 0 wt. % nor more than 20 wt. %.

Incidentally, when relative humidity within a closed space is at low levels, the amount of absorbable moisture is small. Therefore, the amount of moisture absorbable by a moisture absorbent is reduced. Stated another way, there is found a correlation between the amount of absorbing moisture and the relative humidity. Here, in accordance with the present invention, the amount of moisture absorption by the moisture absorbent is not less than 0 wt. % nor more than 20 wt. % and, as a result, the relative humidity within the closed space is held at low levels. Accordingly, dielectric breakdown due to moisture is prevented from occurring.

A fourth invention is a piezoelectric actuator comprising: a piezoelectric actuator main body having a bottom electrode, a piezoelectric element formed on the bottom electrode, and a top electrode, formed on the piezoelectric element, for impressing voltage on the piezoelectric element together with the bottom electrode; a cap member for enclosing at least a surface of the piezoelectric actuator main body on the side of the top electrode; and a moisture absorbent disposed in a closed space between the piezoelectric actuator main body and the cap member and having an ability to absorb moisture, wherein the cap member has, in an interior surface thereof, a water vapor permeability of not more than 7 $g/m^2 \cdot 24$ hr·atm.

As a result of such arrangement, the permeability of water vapor in the interior surface of the cap member is not more than 7 $g/m^2 \cdot 24$ hr·atm, therefore preventing entrance of moisture from outside the closed space into the closed space. Accordingly, dielectric breakdown due to moisture is prevented from occurring.

A fifth invention is a piezoelectric actuator comprising: a piezoelectric actuator main body having a bottom electrode, a piezoelectric element formed on the bottom electrode, and a top electrode, formed on the piezoelectric element, for impressing voltage on the piezoelectric element together with the bottom electrode; a cap member for enclosing at least a surface of the piezoelectric actuator main body on the side of the top electrode; a dividing member disposed within the cap member and dividing a closed space between the piezoelectric actuator main body and the cap member into a first closed space without the piezoelectric actuator main body, and a second closed space which contains the piezoelectric actuator main body; and a moisture absorbent disposed in the first closed space and having an ability to absorb moisture.

As a result of such arrangement, the moisture absorbent is disposed in the first closed space which does not contain the piezoelectric actuator main body, therefore preventing the moisture absorbent and the piezoelectric actuator main body from coming into contact with each other. Accordingly, possible damage to the piezoelectric actuator main body caused by the moisture absorbent is avoided.

In a sixth invention according to the fifth invention, the dividing member supports the moisture absorbent.

Such arrangement eliminates the need for separate provision of a supporting means for supporting the moisture absorbent because the moisture absorbent is supported by the dividing member. Accordingly, the number of component parts of the piezoelectric actuator is reduced.

In a seventh invention according to the fifth invention, the dividing member is formed of a resin material.

Such arrangement makes it possible to change the shape of the dividing member with ease because the dividing member is formed of resin material. Accordingly, the dividing member can be disposed within the cap member by changing the shape of the dividing member in conformity to the shape of the cap member, regardless of the shape of cap member. Accordingly, the dividing member is disposed within the cap member with ease.

In an eighth invention according to the fifth invention, one or more through holes are formed through the dividing member for communication between the first closed space and the second closed space.

The dividing member is provided with one or more through holes for communication between the first closed space and second closed space, thereby enabling the moisture absorbent disposed in the first closed space to efficiently absorb moisture within the second closed space through the through holes. Accordingly, dielectric breakdown due to moisture is effectively prevented from occurring.

In a ninth invention according to the second invention, the piezoelectric actuator main body is subjected to a dehumidification process before the piezoelectric actuator main body is enclosed by the cap member.

Since, prior to the piezoelectric actuator main body being enclosed by the cap member, the piezoelectric actuator main body is subjected to a dehumidification process, this makes it possible to preremove, even when moisture has already entered a void or a pinhole produced within the piezoelectric element, the moisture before the piezoelectric actuator main body is enclosed by the cap member. Accordingly, dielectric breakdown due to moisture is effectively prevented from occurring.

In a tenth invention according to the third invention, the piezoelectric actuator main body is subjected to a dehumidification process before the piezoelectric actuator main body is enclosed by the cap member.

Accordingly, the tenth invention provides the same operation/working-effect that the ninth invention provides.

In an eleventh invention according to the fourth invention, the piezoelectric actuator main body is subjected to a dehumidification process before the piezoelectric actuator main body is enclosed by the cap member.

Accordingly, the eleventh invention provides the same operation/working-effect that the ninth invention provides.

In a twelfth invention according to the fifth invention, the piezoelectric actuator main body is subjected to a dehumidification process before the piezoelectric actuator main body is enclosed by the cap member.

Accordingly, the twelfth invention provides the same operation/working-effect that the ninth invention provides.

In a thirteenth invention according to the ninth invention, the dehumidification process comprises either a process of heating the piezoelectric actuator main body or a process of evacuating air from the piezoelectric actuator main body under vacuum.

The piezoelectric actuator main body is heated or air evacuated under vacuum, which makes it possible to preremove, even when moisture has already entered a void or a pinhole produced within the piezoelectric element, the moisture before the piezoelectric actuator main body is enclosed by the cap member. Accordingly, dielectric breakdown due to moisture is effectively prevented from occurring.

In a fourteenth invention according to the tenth invention, the dehumidification process comprises either a process of heating the piezoelectric actuator main body or a process of evacuating air from the piezoelectric actuator main body under vacuum.

Accordingly, the fourteenth invention provides the same operation/working-effect that the thirteenth invention provides.

In a fifteenth invention according to the eleventh invention, the dehumidification process comprises either a process of heating the piezoelectric actuator main body or a process of evacuating air from the piezoelectric actuator main body under vacuum.

Accordingly, the fifteenth invention provides the same operation/working-effect that the thirteenth invention provides.

In a sixteenth invention according to the twelfth invention, the dehumidification process comprises either a process of heating the piezoelectric actuator main body or a process of evacuating air from the piezoelectric actuator main body under vacuum.

Accordingly, the sixteenth invention provides the same operation/working-effect that the thirteenth invention provides.

In a seventeenth invention according to the second invention, a humidity lowering process in which the piezoelectric actuator main body is left as it is until the moisture absorbent absorbs a predetermined amount of moisture in the closed space is carried out after the piezoelectric actuator main body is enclosed by the cap member.

Since, after the piezoelectric actuator main body is enclosed by the cap member, the piezoelectric actuator main body is subjected to a humidity lowering process in which the piezoelectric actuator main body is let stand until the moisture absorbent absorbs a predetermined amount of moisture in the closed space, this makes it possible to remove moisture within the closed space by the time the ink jet head is put in use. Accordingly, dielectric breakdown due to moisture is effectively prevented from occurring.

In an eighteenth invention according to the third invention, a humidity lowering process in which the piezoelectric actuator main body is left as it is until the moisture absorbent absorbs a predetermined amount of moisture in the closed space is carried out after the piezoelectric actuator main body is enclosed by the cap member.

Accordingly, the eighteenth invention provides the same operation/working-effect that the seventeenth invention provides.

In a nineteenth invention according to the fourth invention, a humidity lowering process in which the piezoelectric actuator main body is left as it is until the moisture absorbent absorbs a predetermined amount of moisture in the closed space is carried out after the piezoelectric actuator main body is enclosed by the cap member.

Accordingly, the nineteenth invention provides the same operation/working-effect that the seventeenth invention provides.

In a twentieth invention according to the fifth invention, a humidity lowering process in which the piezoelectric actuator main body is left as it is until the moisture absorbent absorbs a predetermined amount of moisture in the closed space is carried out after the piezoelectric actuator main body is enclosed by the cap member.

Accordingly, the twentieth invention provides the same operation/working-effect that the seventeenth invention provides.

In a twenty-first invention according to the second invention, the cap member is formed of a metal.

Such arrangement that the cap member is formed of a metal makes it possible to prevent entrance of moisture from outside the closed space into the closed space. Accordingly, dielectric breakdown due to moisture is effectively prevented from occurring.

In a twenty-second invention according to the third invention, the cap member is formed of a metal.

Accordingly, the twenty-second invention provides the same operation/working-effect that the twenty-first invention provides.

In a twenty-third invention according to the fourth invention, the cap member is formed of a metal.

Accordingly, the twenty-third invention provides the same operation/working-effect that the twenty-first invention provides.

In a twenty-fourth invention according to the fifth invention, the cap member is formed of a metal.

Accordingly, the twenty-fourth invention provides the same operation/working-effect that the twenty-first invention provides.

In a twenty-fifth invention according to the second invention, the cap member is fixed onto a surface of the piezoelectric actuator main body.

Such arrangement that the cap member is fixed onto the surface of the piezoelectric actuator main body eliminates the need for separate provision of a cap-member fixing means. Accordingly, the number of component parts of the piezoelectric actuator is reduced.

In a twenty-sixth invention according to the third invention, the cap member is fixed onto a surface of the piezoelectric actuator main body.

Accordingly, the twenty-sixth invention provides the same operation/working-effect that the twenty-fifth invention provides.

In a twenty-seventh invention according to the fourth invention, the cap member is fixed onto a surface of the piezoelectric actuator main body.

Accordingly, the twenty-seventh invention provides the same operation/working-effect that the twenty-fifth invention provides.

In a twenty-eighth invention according to the fifth invention, the cap member is fixed onto a surface of the piezoelectric actuator main body.

Accordingly, the twenty-eighth invention provides the same operation/working-effect that the twenty-fifth invention provides.

In a twenty-ninth invention according to the twenty-fifth invention, the piezoelectric actuator further comprises an electrode interconnection, formed on the top electrode, for transmission of electrical signals to the top electrode, wherein the electrode interconnection is interposed between the cap member and a surface of the piezoelectric actuator main body.

Such arrangement that the electrode interconnection is interposed between the cap member and the surface of the piezoelectric actuator main body makes it possible to prevent the cap member and the piezoelectric actuator main body from coming into contact with each other at a point where the electrode interconnection is interposed between the cap member and the piezoelectric actuator main body surface. Accordingly, it is possible to prevent the cap member from interfering with the operation of the piezoelectric actuator main body.

In a thirtieth invention according to the twenty-sixth invention, the piezoelectric actuator further comprises an electrode interconnection, formed on the top electrode, for transmission of electrical signals to the top electrode, wherein the electrode interconnection is interposed between the cap member and a surface of the piezoelectric actuator main body.

Accordingly, the thirtieth invention provides the same operation/working-effect that the twenty-ninth invention provides.

In a thirty-first invention according to the twenty-seventh invention, the piezoelectric actuator further comprises an electrode interconnection, formed on the top electrode, for transmission of electrical signals to the top electrode, wherein the electrode interconnection is interposed between the cap member and a surface of the piezoelectric actuator main body.

Accordingly, the thirty-first invention provides the same operation/working-effect that the twenty-ninth invention provides.

In a thirty-second invention according to the twenty-eighth invention, the piezoelectric actuator further comprises an electrode interconnection, formed on the top electrode, for transmission of electrical signals to the top electrode, wherein the electrode interconnection is interposed between the cap member and a surface of the piezoelectric actuator main body.

Accordingly, the thirty-second invention provides the same operation/working-effect that the twenty-ninth invention provides.

A thirty-third invention is an ink jet head comprising a piezoelectric actuator as set forth in the first invention.

A thirty-fourth invention is an ink jet head comprising a piezoelectric actuator as set forth in the second invention.

A thirty-fifth invention is an ink jet head comprising a piezoelectric actuator as set forth in the third invention.

A thirty-sixth invention is an ink jet head comprising a piezoelectric actuator as set forth in the fourth invention.

A thirty-seventh invention is an ink jet head comprising a piezoelectric actuator as set forth in the fifth invention.

A thirty-eighth invention is an ink jet head comprising a piezoelectric actuator as set forth in the second invention, and an ink flow path forming member formed on a lower surface of the bottom electrode and having an ink flow path therein, wherein the cap member is fixed onto a surface of the ink flow path forming member.

Such arrangement that the cap member is fixed onto the surface of the ink flow path forming member eliminates the need for separate provision of a cap member fixing means. Accordingly, the number of component parts of the ink jet head is reduced.

A thirty-ninth invention is an ink jet head comprising a piezoelectric actuator as set forth in the third invention, and an ink flow path forming member formed on a lower surface of the bottom electrode and having an ink flow path therein, wherein the cap member is fixed onto a surface of the ink flow path forming member.

Accordingly, the thirty-ninth invention provides the same operation/working-effect that the thirty-eighth invention provides.

A fortieth invention is an ink jet head comprising a piezoelectric actuator as set forth in the fourth invention, and an ink flow path forming member formed on a lower surface of the bottom electrode and having an ink flow path therein, wherein the cap member is fixed onto a surface of the ink flow path forming member.

Accordingly, the fortieth invention provides the same operation/working-effect that the thirty-eighth invention provides.

A forty-first invention is an ink jet head comprising a piezoelectric actuator as set forth in the fifth invention, and an ink flow path forming member formed on a lower surface of the bottom electrode and having an ink flow path therein, wherein the cap member is fixed onto a surface of the ink flow path forming member.

Accordingly, the forty-first invention provides the same operation/working-effect that the thirty-eighth invention provides.

In a forty-second invention according to the thirty-eighth invention, a step portion is formed in an upper peripheral area of the ink flow path forming member and the cap member fits with the step portion of the ink flow path forming member.

Since the cap member fits with the step portion of the ink flow path forming member, the cap member and the piezoelectric actuator main body are in non-contact with each other. Accordingly, it is possible to prevent the cap member from interfering with the operation of the piezoelectric actuator main body.

In a forty-third invention according to the thirty-ninth invention, a step portion is formed in an upper peripheral area of the ink flow path forming member and the cap member fits with the step portion of the ink flow path forming member.

Accordingly, the forty-third invention provides the same operation/working-effect that the forty-second invention provides.

In a forty-fourth invention according to the fortieth invention, a step portion is formed in an upper peripheral area of the ink flow path forming member and the cap member fits with the step portion of the ink flow path forming member.

Accordingly, the forty-fourth invention provides the same operation/working-effect that the forty-second invention provides.

In a forty-fifth invention according to the forty-first invention, a step portion is formed in an upper peripheral area of the ink flow path forming member and the cap member fits with the step portion of the ink flow path forming member.

Accordingly, the forty-fifth invention provides the same operation/working-effect that the forty-second invention provides.

A forty-sixth invention is an ink jet head comprising a piezoelectric actuator as set forth in the twenty-first invention, and a metallic ink flow path forming member formed on a lower surface of the bottom electrode and having an ink flow path therein, wherein the cap member is joined, by welding, to the ink flow path forming member.

Since the cap member is joined to the ink flow path forming member by welding, this eliminates the need for separate provision of a cap member fixing means. Accordingly, the number of component parts of the ink jet head is reduced.

Further, since the cap member is joined to the ink flow-path forming member by welding, this makes it possible to prevent entrance of moisture from outside the closed space into the closed space from between the cap member and the ink flow path forming member. Accordingly, dielectric breakdown due to moisture is effectively prevented from occurring.

A forty-seventh invention is an ink jet head comprising a piezoelectric actuator as set forth in the twenty-second invention, and a metallic ink flow path forming member formed on a lower surface of the bottom electrode and having an ink flow path therein, wherein the cap member is joined, by welding, to the ink flow path forming member.

Accordingly, the forty-seventh invention provides the same operation/working-effect that the forty-sixth invention provides.

A forty-eighth invention is an ink jet head comprising a piezoelectric actuator as set forth in the twenty-third invention, and a metallic ink flow path forming member formed on a lower surface of the bottom electrode and having an ink flow path therein, wherein the cap member is joined, by welding, to the ink flow path forming member.

Accordingly, the forty-eighth invention provides the same operation/working-effect that the forty-sixth invention provides.

A forty-ninth invention is an ink jet head comprising a piezoelectric actuator as set forth in the twenty-fourth invention, and a metallic ink flow path forming member formed on a lower surface of the bottom electrode and having an ink flow path therein, wherein the cap member is joined, by welding, to the ink flow path forming member.

Accordingly, the forty-ninth invention provides the same operation/working-effect that the forty-sixth invention provides.

In a fiftieth invention according to the forty-sixth invention, a step portion is formed in an upper peripheral area of the ink flow path forming member and the cap member is joined, by welding, to the step portion of the ink flow path forming member.

Since the cap member is joined to the step portion of the ink flow path forming member by welding, the cap member and the piezoelectric actuator main body are in non-contact with each other. Accordingly, it is possible to prevent the cap member from interfering with the operation of the piezoelectric actuator main body.

In a fifty-first invention according to the forty-seventh invention, a step portion is formed in an upper peripheral area of the ink flow path forming member and the cap member is joined, by welding, to the step portion of the ink flow path forming member.

Accordingly, the fifty-first invention provides the same operation/working-effect that the fiftieth invention provides.

In a fifty-second invention according to the forty-eighth invention, a step portion is formed in an upper peripheral area of the ink flow path forming member and the cap member is joined, by welding, to the step portion of the ink flow path forming member.

Accordingly, the fifty-second invention provides the same operation/working-effect that the fiftieth invention provides.

In a fifty-third invention according to the forty-ninth invention, a step portion is formed in an upper peripheral area of the ink flow path forming member and the cap member is joined, by welding, to the step portion of the ink flow path forming member.

Accordingly, the fifty-third invention provides the same operation/working-effect that the fiftieth invention provides.

In a fifty-fourth invention according to the thirty-eighth invention, one or more ink supply openings for supplying of ink to the ink flow path are opened in a surface of the ink flow path forming member, and said cap member is fixed to a region of the ink flow path forming member surface other than where the ink supply openings are provided.

Incidentally, an ink tank for storing ink is connected to each ink supply opening. And, when the ink held in the ink tank is used up, the ink tank must be replaced with a new one. If the cap member is mounted in a surface region of the ink flow path forming member where the ink supply openings are provided, this impedes the replacing of an ink tank.

On the other hand, in accordance with the present invention, the cap member is fixed in a surface region of the ink flow path forming member other than where the ink supply openings are provided. Therefore, the replacing of an ink tank will not be impeded by the cap member. This therefore facilitates ink tank replacement.

In a fifty-fifth invention according to the thirty-ninth invention, one or more ink supply openings for supplying of ink to the ink flow path are opened in a surface of the ink flow path forming member, and said cap member is fixed to a region of the ink flow path forming member surface other than where the ink supply openings are provided.

Accordingly, the fifty-fifth invention provides the same operation/working-effect that the fifty-fourth invention provides.

In a fifty-sixth invention according to the fortieth invention, one or more ink supply openings for supplying of ink to the ink flow path are opened in a surface of the ink flow path forming member, and said cap member is fixed to a region of the ink flow path forming member surface other than where the ink supply openings are provided.

Accordingly, the fifty-sixth invention provides the same operation/working-effect that the fifty-fourth invention provides.

In a fifty-seventh invention according to the forty-first invention, one or more ink supply openings for supplying of ink to the ink flow path are opened in a surface of the ink flow path forming member, and said cap member is fixed to a region of the ink flow path forming member surface other than where the ink supply openings are provided.

Accordingly, the fifty-seventh invention provides the same operation/working-effect that the fifty-fourth invention provides.

A fifty-eighth invention is an ink jet head according to the thirty-eighth invention which further comprises an electrode interconnection for transmission of electrical signals to the top electrode, wherein the electrode interconnection is interposed between the cap member and the ink flow path forming member.

A fifty-ninth invention is an ink jet head according to the thirty-ninth invention which further comprises an electrode interconnection for transmission of electrical signals to the top electrode, wherein the electrode interconnection is interposed between the cap member and the ink flow path forming member.

A sixtieth invention is an ink jet head according to the fortieth invention which further comprises an electrode interconnection for transmission of electrical signals to the top electrode, wherein the electrode interconnection is interposed between the cap member and the ink flow path forming member.

A sixty-first invention is an ink jet head according to the forty-first invention which further comprises an electrode interconnection for transmission of electrical signals to the top electrode, wherein the electrode interconnection is interposed between the cap member and the ink flow path forming member.

A sixty-second invention is an ink jet type recording device comprising an ink jet head according to the thirty-third invention.

A sixty-third invention is an ink jet type recording device comprising an ink jet head according to the thirty-fourth invention.

A sixty-fourth invention is an ink jet type recording device comprising an ink jet head according to the thirty-fifth invention.

A sixty-fifth invention is an ink jet type recording device comprising an ink jet head according to the thirty-sixth invention.

A sixty-sixth invention is an ink jet type recording device comprising an ink jet head according to the thirty-seventh invention.

A sixty-seventh invention is a method of manufacturing a piezoelectric actuator, comprising the steps of: subjecting a piezoelectric actuator main body, formed by laminating together a bottom electrode, a piezoelectric element, and a top electrode in sequence, to a dehumidification process; placing a moisture absorbent having an ability to absorb moisture within a cap member; and enclosing at least a surface of the piezoelectric actuator main body on the side of the top electrode by the cap member.

A sixty-eighth invention is a method of manufacturing a piezoelectric actuator, comprising the steps of: placing a moisture absorbent having an ability of absorb moisture within a cap member; enclosing at least a surface of a piezoelectric actuator, formed by laminating together a bottom electrode, a piezoelectric element, and a top electrode in sequence, on the side of the top electrode by the cap member; and leaving the piezoelectric actuator main body as it is until the moisture absorbent absorbs a predetermined amount of moisture in a closed space between the piezoelectric actuator main body and the cap member.

BEST MODE FOR CARRYING OUT INVENTION

Embodiment 1

Figure 1:
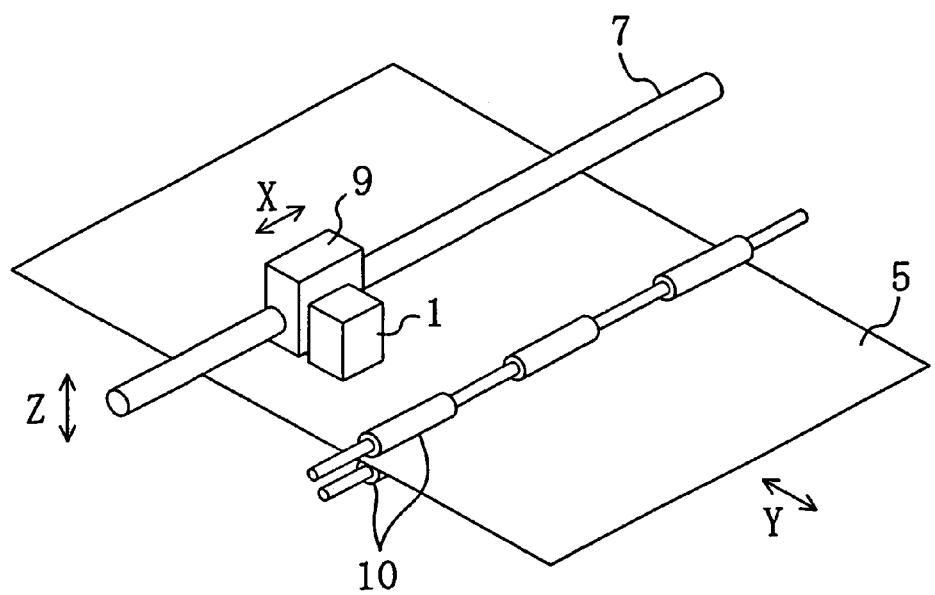
FIG. 1 is a schematic construction diagram of an ink jet type recording device according to an embodiment of the present invention.

As shown in FIG. 1, an ink jet head 1 of the present embodiment, incorporated into an ink jet printer 3 as an ink jet type recording device, effects recording by shooting droplets of ink onto a recording medium 5 such as a sheet of paper.

The ink jet head 1, mounted on a carriage 9 which travels to and fro along a carriage shaft 7, reciprocates in a primary scan direction X, together with the carriage 9. A roller 10 is so constructed as to convey the recording medium 5 in a secondary scan direction Y every time the carriage 9 travels a scan distance in the primary scan direction X.

Figure 2:
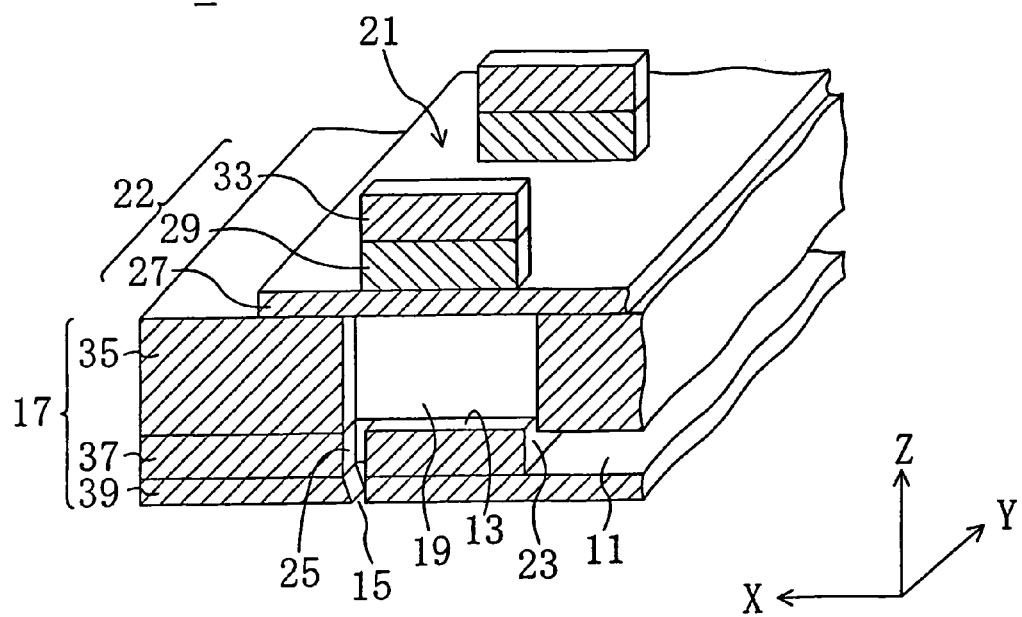
FIG. 2 is a perspective view showing, in partially broken manner, an ink jet head according to the embodiment.
Figure 3:
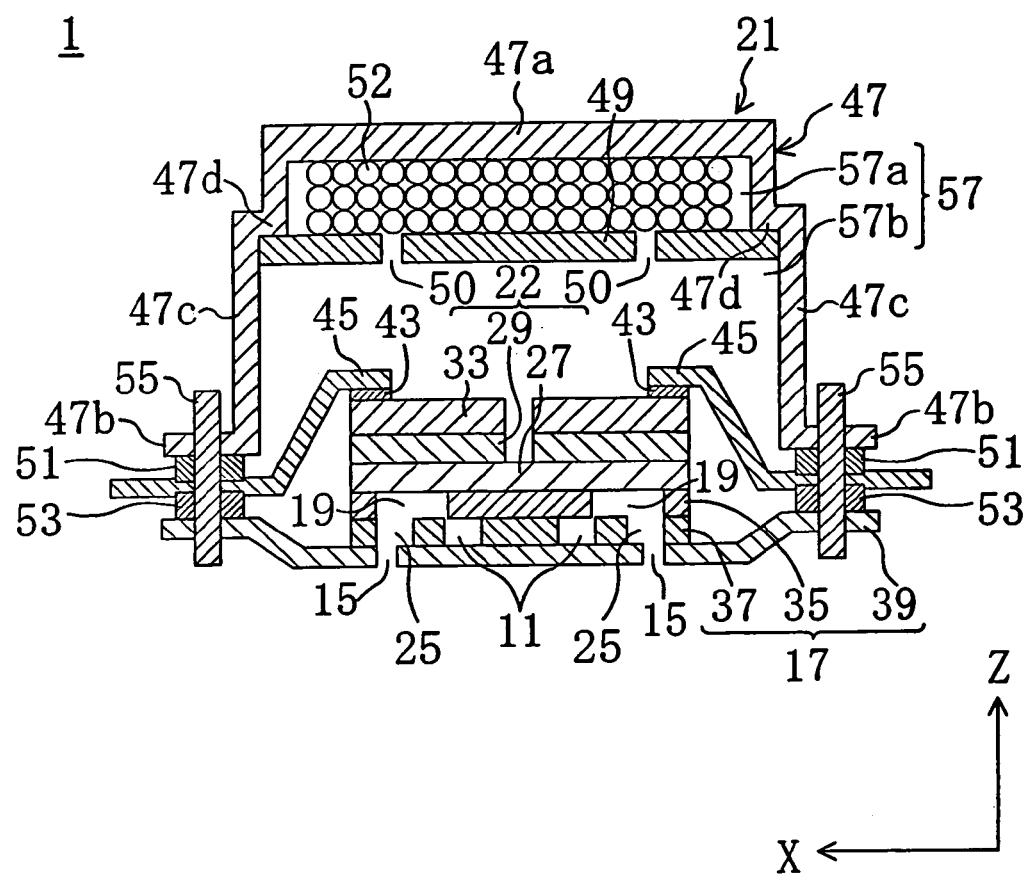
FIG. 3 is a cross-sectional view of the ink jet head according to the embodiment.

As shown in FIGS. 2 and 3, the ink jet head 1 comprises a head main body part 17 in which are formed a common ink chamber 11, a plurality of pressure chamber recessed portions 13 (not shown in FIG. 3), and a plurality of nozzles 15, and a piezoelectric actuator 21 for applying voltage to the ink within a pressure chamber 19. The pressure chamber recessed portions 13 are arrayed at predetermined intervals along the secondary scan direction Y. The pressure chamber recessed portions 13 thus arrayed constitute rows of pressure chamber recessed portions. The ink jet head 1 of the present embodiment has two pressure chamber recessed portion rows. Each pressure chamber recessed portion 13 has an opening cross section (X-Y cross section) shaped like a rectangular which is oblong in the primary scan direction X. Note that the ink flow path as referred to in the present invention is made up of the common ink chamber 11 and an ink supply path 41 which will be described later.

The head main body part 17 is made up of a pressure chamber forming plate 35 of Si, an ink flow path forming plate 37 of stainless steel, and a nozzle plate 39 of stainless steel. Formed in the pressure chamber forming plate 35 is the pressure chamber 19. An ink supply opening 23 connecting together the common ink chamber 11 and the pressure chamber 19 is formed at one longitudinal end (right-hand side end in FIG. 2) of the bottom of each pressure chamber recessed portion 13 in the ink flow path forming plate 37. Formed at the other longitudinal end (left-hand side end in FIG. 2) is an ink flow path 25 connecting together the pressure chamber 19 and the nozzles 15. In addition, the common ink chamber 11 extending in the secondary scan direction Y is formed in the ink flow path forming plate 37.

Figure 4:
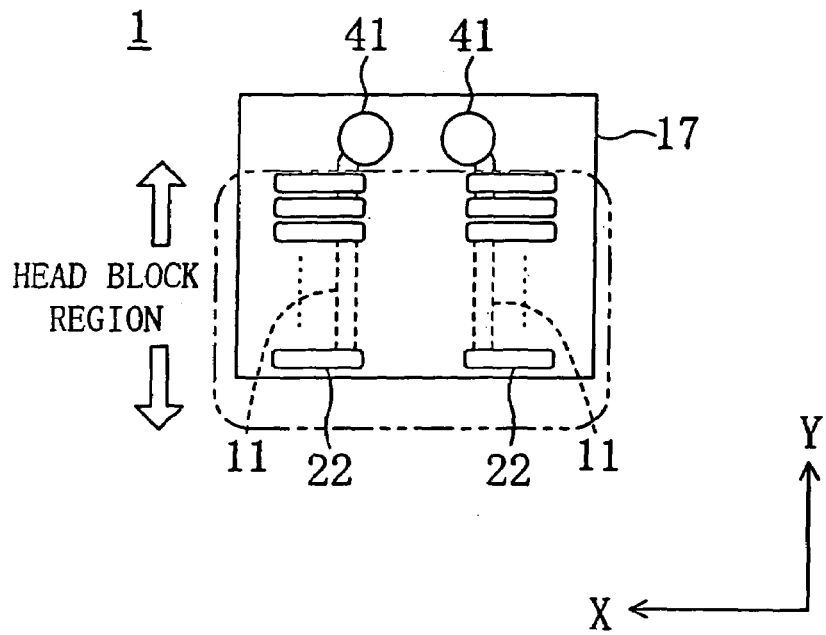
FIG. 4 is a top plan view of the ink jet head according to the embodiment.

As shown in FIG. 4, one end of the common ink chamber 11 (upper end in FIG. 4) is connected to the ink supply path 41. The ink supply path 41 is so formed as to extend over the pressure chamber forming plate 35 and the ink flow path forming plate 37 in a Z direction. One end of the ink supply path 41 is connected to the common ink chamber 11 and the other end thereof is connected to an ink tank (not shown). As shown in FIG. 3, the nozzle plate 39 extends longer than the piezoelectric actuator 21, the pressure chamber forming plate 35, and the ink flow path forming plate 37 in the primary scan direction X as well as in the secondary scan direction Y. Furthermore, as shown in FIGS. 2 and 3, the nozzles 15 are formed in the nozzle plate 39. In addition, the ink flow path forming member as referred to in the present invention is made up of the pressure chamber forming plate 35, the ink flow path forming plate 37, and the nozzle plate 39, and the step portion is formed by a step between the ink flow path forming plate 37 and the nozzle plate 39, and the ink supply opening is formed by an end portion of the ink supply path 41 on the side of the ink tank.

As shown in FIGS. 2 and 3, the piezoelectric actuator 21 has: a piezoelectric actuator part 22 made up of a common electrode 27 of Cr having a thickness of from 1 to 10 µm, a piezoelectric element 29 of Pb(Zr, Ti)O$_3$ having a thickness of 3.0 µm and formed on the common electrode 27, and an individual electrode 33 of Pt having a thickness of 0.1 µm and formed on the piezoelectric element 29; an electrical interconnection joint part 43 formed on the individual electrode 33; an electrical interconnection 45 formed on the electrical interconnection joint part 43; a head block 47 fixed to the nozzle plate 39 through the electrical interconnection 45; and a PI tape 49 disposed within the head block 47. Note that the electrical interconnection joint part 43, the electrical interconnection 45, the head block 47, and the PI tape 49 are not represented diagrammatically in FIG. 2. The common electrode 27 acts also as a vibrating plate. The piezoelectric element 29 and the individual electrode 33 are so disposed as to be located at areas corresponding to their respective pressure chamber recessed portions 13 of the head main body part 17. The individual electrode 33 and the electrical interconnection 45 are connected together through the electrical interconnection joint part 43. The electrical interconnection 45 is connected to one end of each individual electrode 33 as well as to a voltage input terminal part (not shown) for impressing voltage on each individual electrode 33. In addition, the bottom electrode as referred to in the present invention is formed by the common electrode 27, and the top electrode is formed by the individual electrode 33, and the piezoelectric actuator main body is formed by the piezoelectric actuator part 22, and the cap member is formed by the head block 47, and the dividing member is formed by the PI tape 49.

Figure 5:
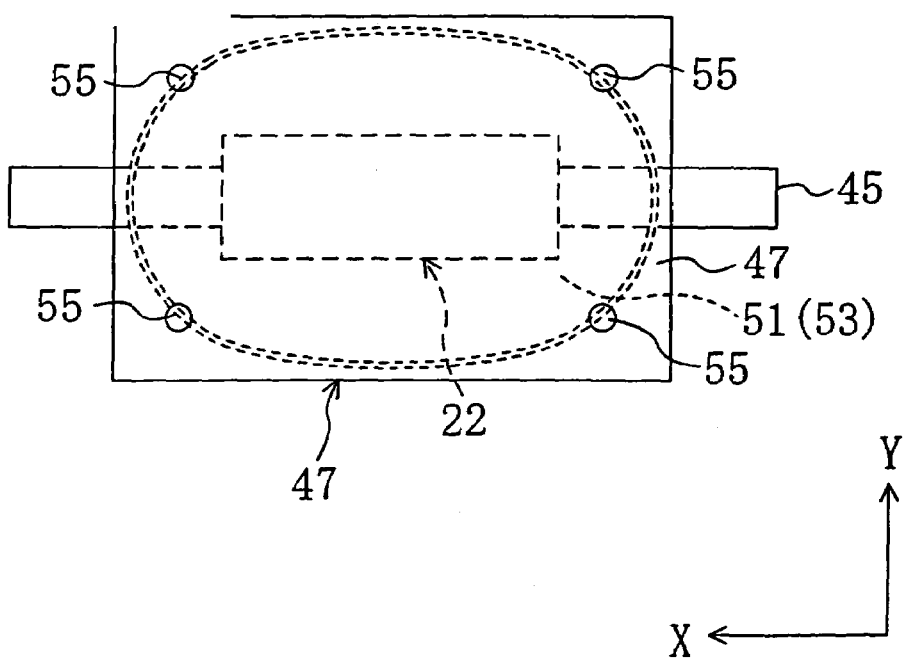
FIG. 5 is a schematic top plan view of the ink jet head according to the embodiment.

As shown in FIGS. 3 and 5, an upper surface portion 47a of the head block 47 is shaped like a rectangle. A step portion 47d is formed in a side surface portion 47c of the head block 47. In other words, the step portion 47d of the head block 47 bends at right angles relative to an upper and a lower portion of the side surface portion 47c. An end portion of the head block 47 bends at right angles relative to the side surface portion 47c to form a collar portion 47b. In the way as described above, the head block 47 is shaped like a hat. In addition, the head block 47 is made of stainless steel.

The head block 47 is fixed, through a substantially O-shaped first O-ring 51 of resin, the electrical interconnection 45, and a second O-ring 53, to an upper surface of the nozzle plate 36 by presser jigs 55 such as turn fasteners, push rivets or the like. More specifically, the four corners of the collar portion 47b of the head block 47 and the upper surface four corners of the nozzle plate 39 are fixed together by the four presser jigs 55. In addition, a lower end of each presser jig 55 lies above the lower surface of the nozzle plate 39.

A closed space 57 is formed within the head block 47. And, the piezoelectric actuator part 22 is sealed within the closed space 57. In addition, the head block 47 is in non-contact with the piezoelectric actuator part 22. Furthermore, as shown in FIG. 4, the head block 47 is disposed on a region (indicated by a chain double-dashed line of FIG. 4) of the upper surface of the head main body part 17 other than where the ink supply path 41 is formed. Note that diagrammatic representation of the head block 47 is omitted in FIG. 4.

Further, as has been described above, the head block 47 is made of stainless steel, and the permeability of water vapor in the interior surface of the head block 47 is not more than 7.0 g/m$^2$·24 hr·atm. Generally, the permeability of water vapor indicates the amount of water vapor passing through the head block 47 of a unit area. Furthermore, the interior surface of the head block 47 is a surface of the head block 47 in contact with the closed space 57. In the present embodiment, particularly the permeability of water vapor is defined as the amount of water vapor passing through the head block 47 with an interior surface area of 1 m$^2$ per 24 hours in a 1-atm environment. Note that the thickness of the head block 47 is unconsidered here.

As shown in FIG. 3, the PI tape 49 is formed of a resin material and is so disposed, in spanned manner, at the step portion 47d of the head block 47 as not to come into contact with the piezoelectric actuator part 22. Stated another way, the PI tape 49 is affixed to the step portion 47d of the head block 47. And, the PI tape 49 divides the closed space 57 into two sections. Of these divided sections of the closed space 57, the one on the side of the head block 47 (upper section in FIG. 3) constitutes a first closed space 57a and the other on the side of the piezoelectric actuator part 22 (lower section in FIG. 3) constitutes a second closed space 57b. The moisture absorbent 52 is sealed within the first closed space 57a. The moisture absorbent 52 has, as an indication of the efficiency of moisture absorption, a coefficient of moisture absorption of not less than 5 wt. % in a measurement environment of 25° C., 1 atm, and 80% relative humidity. In the present embodiment, the moisture absorbent 52 comprises granulated silica gel and is supported by the PI tape 49. Furthermore, one or more through holes 50 for establishing communication between the first closed space 57a and the second closed space 57b are formed in the PI tape 49. The bore diameter of the through holes 50 is smaller than the diameter of the moisture absorbent 52.

Operating Method of Ink Jet Head

Here, an operating method of the ink jet head according to the present embodiment will be described. In the first place, voltage is impressed on the common electrode 27 as well as on the individual electrode 33. This voltage impression on both the electrodes 27 and 33 causes the piezoelectric element 29 to expand and contract. Such expansion/contraction is restricted by the common electrode 27 serving also as a vibrating plate, thereby causing the piezoelectric actuator part 22 to bend and deform in the lamination direction. Such bending/deformation causes the volume of the pressure chamber 19 to vary and, as a result, ink in the inside of the pressure chamber 19 flows through the ink flow path 25 and is emitted from the nozzle 15.

Method for Evaluation of Dielectric Breakdown Occurrence Rate

In the present experiments, a plurality of ink jet heads 1 were prepared as samples for the purpose of evaluation of the rate of occurrence of dielectric breakdown to be hereinafter described. Each ink jet head 1 prepared comprises: a piezoelectric actuator part 22 formed by laminating together, in sequence, a head main body part 17, a common electrode 27, a piezoelectric element 29, and an individual electrode 33; a head block 47 fixed to the head main body part 17; and a moisture absorbent 52 sealed within a closed space 57 defined between the head main body part 17 and the head block 47. Each ink jet head 1 is made up of 400-pin nozzles 15 and piezoelectric actuator parts 22. Additionally, these ink jet heads 1 were prepared in three types, namely ink jet heads 1 having a closed space 57 the volume of which is $1.96×10^{-6}$ m³, ink jet heads 1 having a closed space 57 the volume of which is $2.93×10^{-5}$ m³, and ink jet heads 1 having a closed space 57 the volume of which is $3.72×10^{-5}$ m³. And, the ink jet heads 1 of each type were placed in a measurement environment of 60° C. and 1 atm, and the closed spaces 57 of the ink jet heads 1 were at different relative humidity levels. Then, a dc voltage of 35V was impressed between the common electrode 27 and the individual electrode 33 of each ink jet head 1 for 150 hours, and pins broken in the electrodes 27 and 33 or pins broken in the piezoelectric element 29 due to the occurrence of dielectric breakdown were counted. And, in each ink jet head 1, the ratio of the number of broken pins to the total number of pins was calculated and the result was used as a dielectric breakdown occurrence rate.

Figure 6:
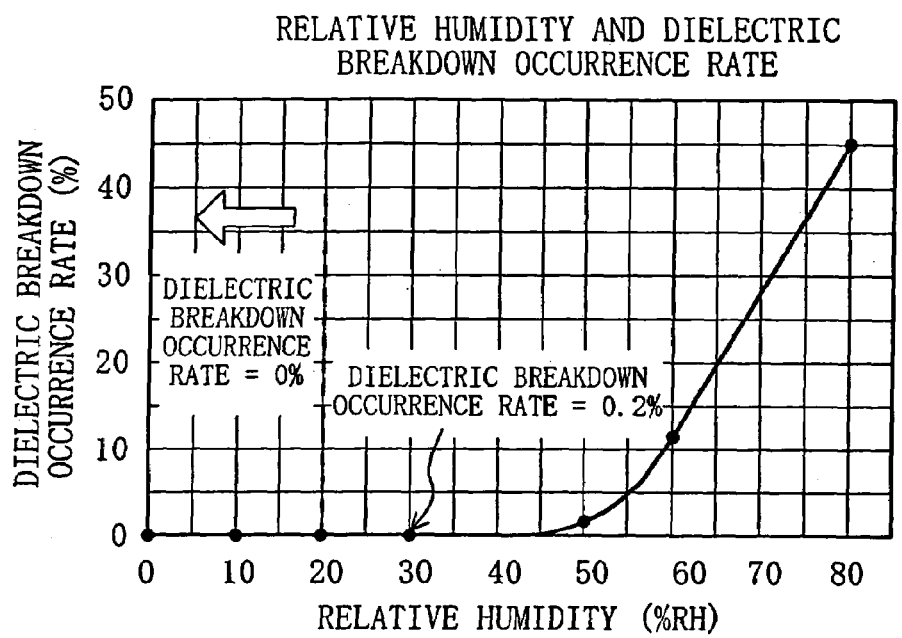
FIG. 6 graphically shows a relationship between the relative humidity within a closed space according to the embodiment, and the rate of occurrence of dielectric breakdown.

The results of the above-described measurements show clearly that the rate of occurrence of dielectric breakdown is 0% when the relative humidity within the closed space 57 is not less than 0% nor more than 20% (see FIG. 6). Additionally, it becomes obvious that, when the relative humidity within the closed space 57 is not less than 20% nor more than 40%, the rate of occurrence of dielectric breakdown is substantially 0%.

The foregoing measurements were carried out in an environment of 60° C. However, even in environments other than the 60° C. environment, the rate of occurrence of dielectric breakdown is 0% if the relative humidity within the closed space 57 is not less than 0% nor more than 20%. For the closed space 57 of 1 m³, the amount of saturation water vapor is about 130 g when the temperature is 60° C. and the atmospheric pressure is 1 atm. Here, if the relative humidity within the closed space 57 is 20%, then the amount of water vapor present within the closed space 57 is: 130×0.20=26 g. Therefore, the rate of occurrence of dielectric breakdown becomes substantially 0% as long as the amount of water vapor present within the closed space 57 of 1 m³ in an environment of 60° C. and 1 atm is not more than 26 g.

Additionally, in order to examine the relationship between the amount of moisture absorption of the moisture absorbent 52 and the rate of occurrence of dielectric breakdown, measurements, in which a direct current voltage of 35V was impressed between the common electrode 27 and the individual electrode 33 of each ink jet head 1 for 150 hours, were carried out in addition to the foregoing measurements, for dielectric breakdown occurrence rate calculation. Here, the amount of moisture absorption is represented by: (the weight of the moisture absorbent 52 after moisture absorption−the weight of the moisture absorbent 52 before moisture absorption)/the weight of the moisture absorbent 52 before moisture absorption.

Figure 7:
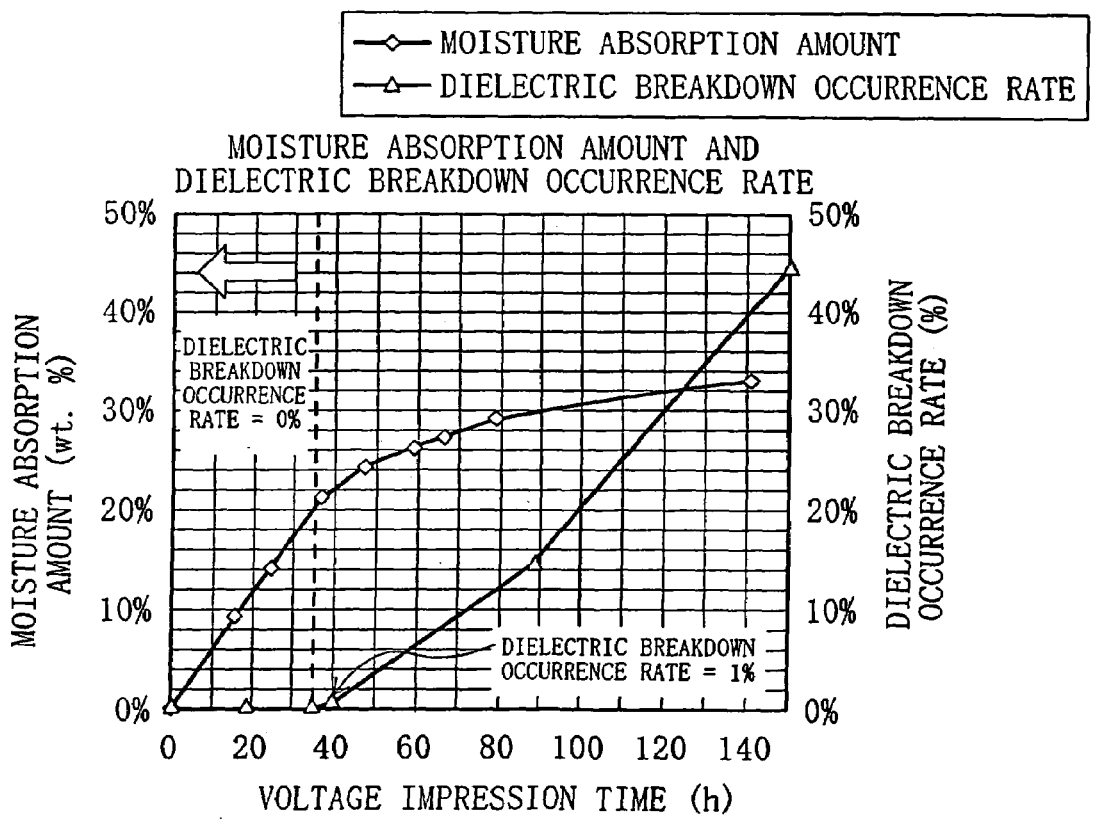
FIG. 7 graphically shows a relationship between the amount of moisture absorption of a moisture absorbent according to the embodiment, and the rate of occurrence of dielectric breakdown.

The results of the above measurements show clearly that the rate of occurrence of dielectric breakdown is 0% when the amount of moisture absorption of the moisture absorbent 52 is not less than 0 wt. % nor more than 20 wt. % (see FIG. 7).

Additionally, a plurality of ink jet heads 1 each having a different water vapor permeability in the interior surface of the head block 47 thereof were prepared for different measurements from the foregoing measurements. More specifically, in a high temperature and humidity measurement environment of 80% relative humidity and 60° C., a direct current voltage of 35V was impressed between the common electrode 27 and the individual electrode 33 of each ink jet head 1 for 150 hours, for dielectric breakdown occurrence rate calculation.

Figure 8:
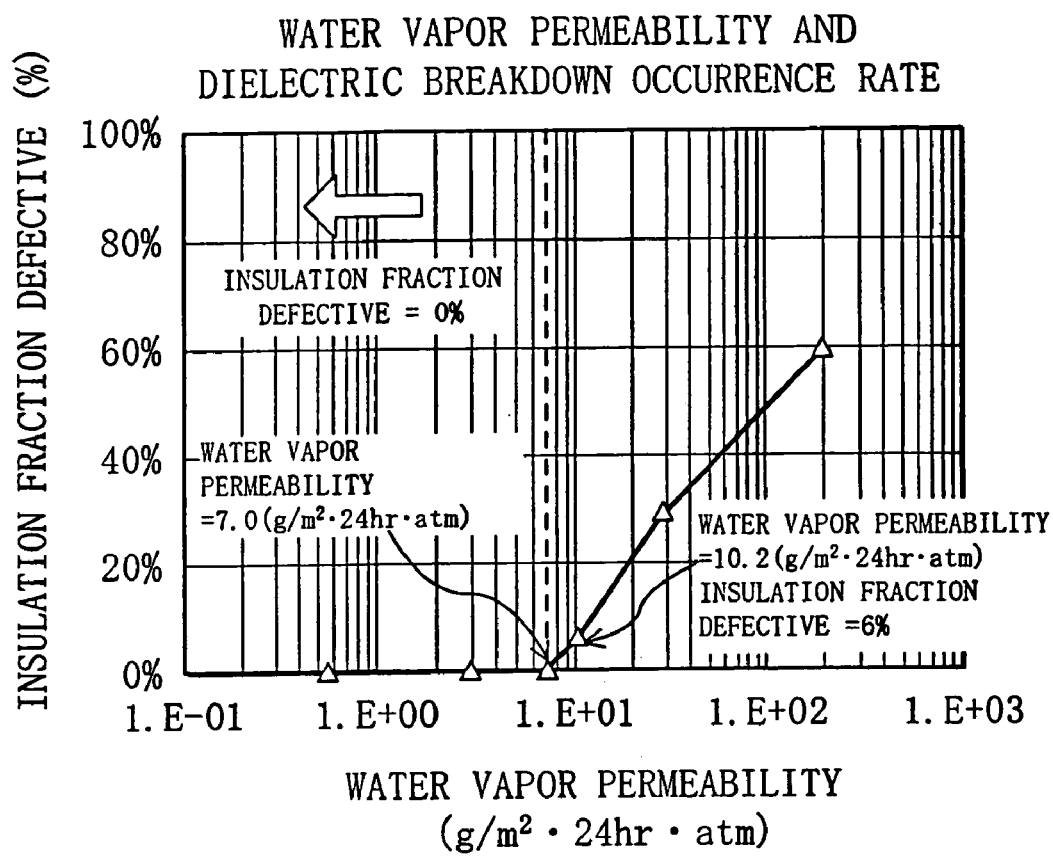
FIG. 8 graphically shows a relationship between the permeability of water vapor in an interior surface of a head block according to the embodiment, and the rate of occurrence of dielectric breakdown.

The results of the above measurements show clearly that the rate of occurrence of dielectric breakdown is 0% when the permeability of water vapor in the interior surface of the head block 47 is not more than 7.0 g/m²·24 hr·atm (see FIG. 8).

Method of Manufacture for Ink Jet Head

Referring next to FIGS. 9 and 10, a method of manufacturing an ink jet head 1 will be described.

Figure 9A:
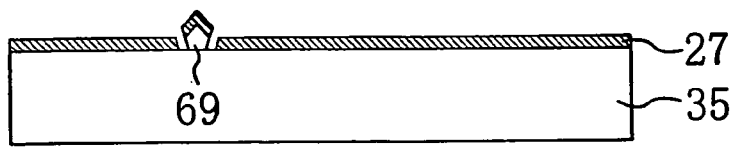
FIG. 9 is a first part of a manufacturing process diagram of the ink jet head according to the embodiment.

In the first place, a common electrode 27 is formed on a pressure chamber forming plate 35 (see FIG. 9A).

Figure 9B:
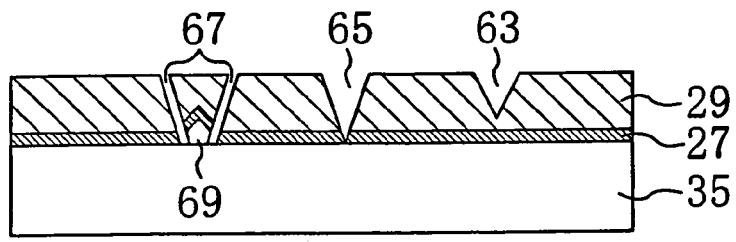

In the next place, a piezoelectric element 29 is formed on the common electrode 27 by sputtering, vapor deposition, or the like (FIG. 9B). In the course of such formation, there is the possibility that either a defective portion 63 is formed within the piezoelectric element 29 or defective portions 65 and 67 continuously extending through the common electrode 27 and the piezoelectric element 29 are formed. The defective portions 63 and 65 are pinholes caused by contaminants adhered onto the pressure chamber forming plate 35 when sputtering the piezoelectric element 29. On the other hand, the defective portion 67 is a void resulting from abnormal growth of the piezoelectric element 29 caused by a contaminant 69 adhered onto the pressure chamber forming plate 35. The pinholes 63 and 65 and the void 67 are from 0.1 to 10 μm in opening diameter.

Figure 9C:
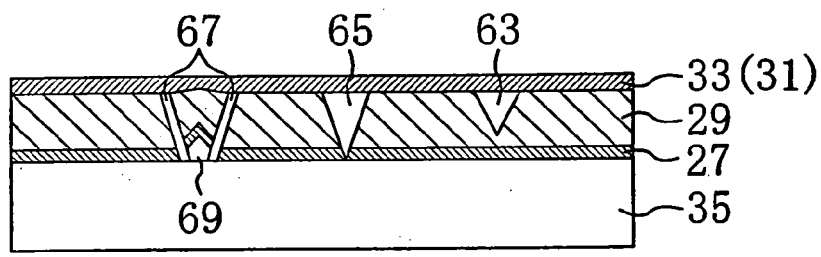

Next, a top electrode 31 is formed on the piezoelectric element 29 by sputtering, vapor deposition, or the like (FIG. 9C). Then, the top electrode 31 and the piezoelectric element 29 are individualized to form individual electrodes 33 and the piezoelectric element 29 located at other than where the individual electrodes 33 is formed is removed. Here, such individualization is done by etching or the like.

Thereafter, the ink jet head 1 which has undergone the foregoing steps, i.e., the ink jet head 1 on which a head block 47 has not been mounted yet is subjected to a dehumidification process. More specifically, the ink jet head 1 is heated at 100 to 150° C. Furthermore, the ink jet head 1 is air evacuated under vacuum.

Figure 9D:
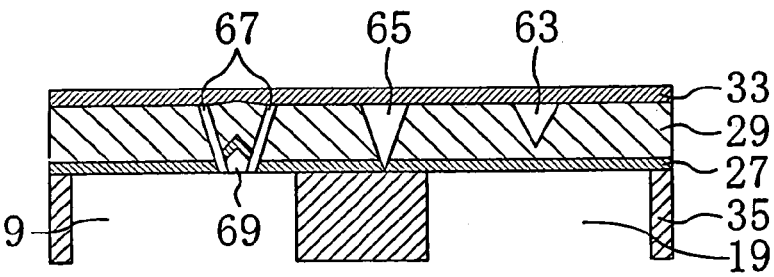

Next to the above, the pressure chamber forming plate 35 is worked to form a pressure chamber 19 (FIG. 9D). In order to prevent the common electrode 27 from becoming damaged when the pressure chamber 19 is formed by working the pressure chamber forming plate 35, a stopper layer (not shown) may be provided between the pressure chamber forming plate 35 and the common electrode 27.

Figure 9E:
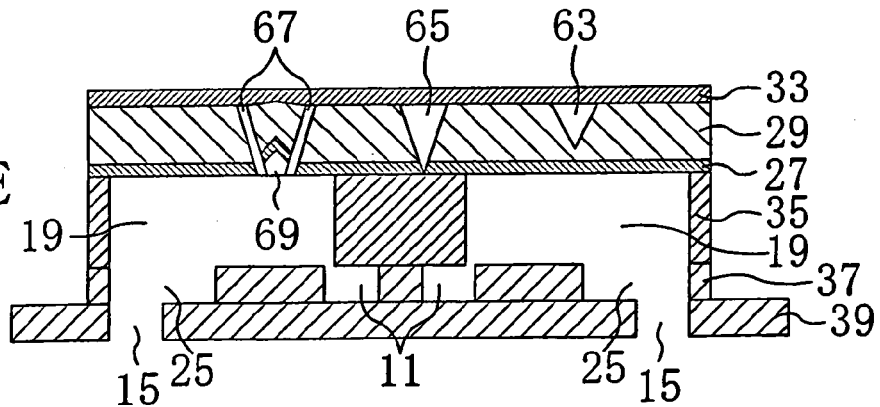

Thereafter, an integrated combination of an ink flow path forming plate 37 in which are formed an ink flow path 25 and so on and a nozzle plate 39 in which is formed a nozzle 15 is mounted onto the pressure chamber forming plate 35 (FIG. 9E). Thereafter, an electrical interconnection joint part 43 and an electrical interconnection 45 are formed, in that order, on the individual electrode 33, which is not represented diagrammatically.

Figure 10A:
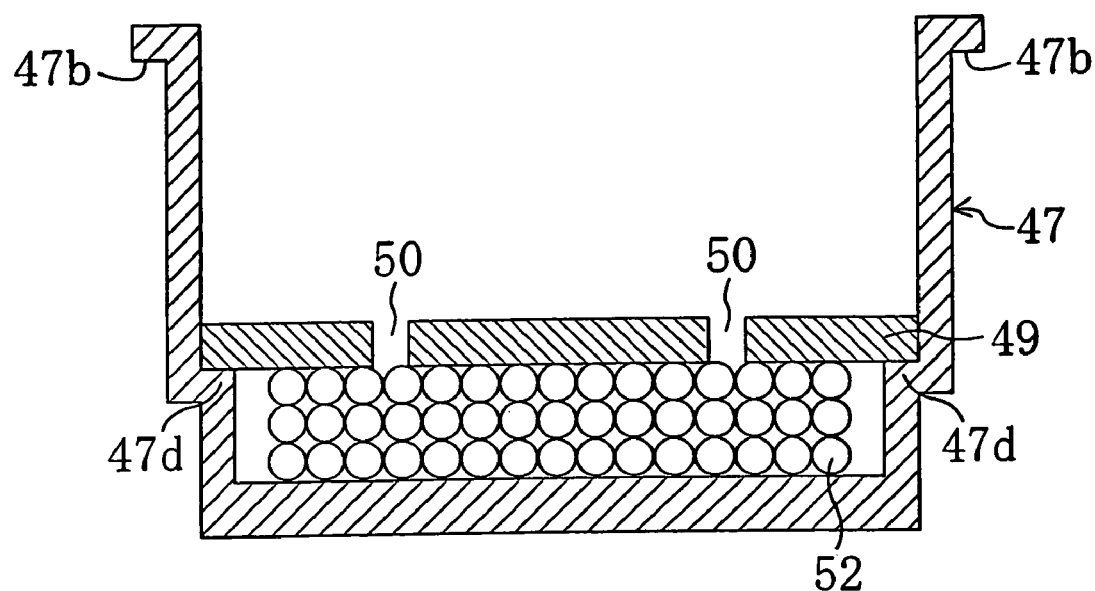
FIG. 10 is a second part of the manufacturing process diagram of the ink jet head according to the embodiment.

Next, a moisture absorbent 52 is fed within a head block 47 prepared separately from the ink jet head 1 (FIG. 10A). Thereafter, a PI tape 49 is affixed within the head block 47 so that the moisture absorbent 52 is sealed within the head block 47.

Figure 10B:
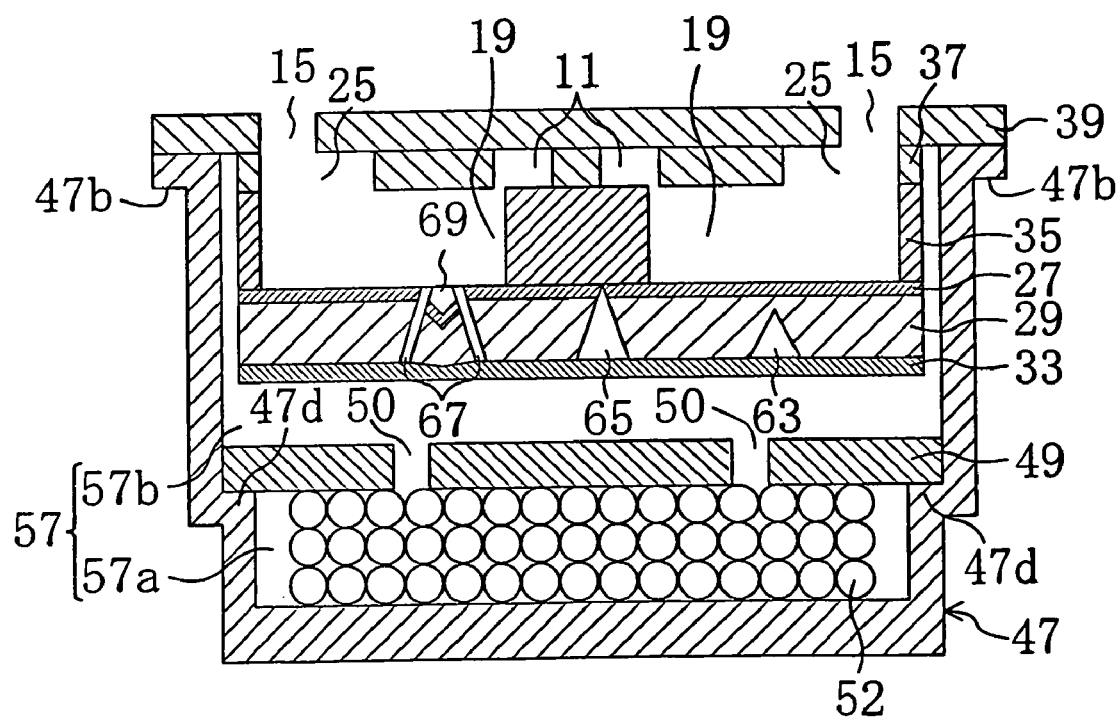

Finally, as shown in FIG. 10B, the nozzle plate 39 of the ink jet head 1 and the collar portion 47b of the head block 47 are fixed together. Here, diagrammatic representation of the first O-ring 51, the second O-ring 53, and the presser jig 55 is omitted. In this way, the formation of the ink jet head 1 is completed.

Before being put in actual operation, the formation-completed ink jet head 1 is left as it is in a low humidity environment for a certain period of time until the moisture absorbent 52 absorbs a predetermined amount of moisture within the closed space 57.

After the above-described steps, it is achieved that the relative humidity within the closed space 57 of the ink jet head 1 is not less than 0% nor more than 20% and the amount of moisture absorption of the moisture absorbent 52 is not less than 0 wt. % nor more than 20 wt. %.

As has been described above, in accordance with the present embodiment, the ink jet head 1 on which the head block 47 has not been mounted yet is subjected to a heating process at 100 to 150° C. and to an air excavating process under vacuum. Therefore, even when a void 67 and pinholes 63 and 65 occur within the piezoelectric element 29, thereby resulting in entrance of moisture thereinto, the moisture is preremoved before the head block 47 is mounted on the ink jet head 1. Accordingly, dielectric breakdown due to moisture is prevented from occurring.

Besides, before being put in actual operation, the formation-completed ink jet head 1 is left as it is in a low humidity environment for a certain period of time until the moisture absorbent 52 absorbs a predetermined amount of moisture within the closed space 57, thereby making it possible for the moisture absorbent 52 to absorb moisture within the closed space 57 before the ink jet head 1 is brought into actual operation. Accordingly, dielectric breakdown due to moisture is prevented from occurring when the ink jet head 1 is put in actual operation.

Furthermore, since the moisture absorbent 52 is sealed within the first closed space 57a by the PI tape 49, this makes it possible to prevent the moisture absorbent 52 and the piezoelectric actuator part 22 from coming into contact with each other. Accordingly, it is possible to prevent the piezoelectric actuator part 22 from becoming damaged by the moisture absorbent 52.

Moreover, since the moisture absorbent 52 is supported by the PI tape 49, this eliminates the need for separate provision of a supporting means for supporting the moisture absorbent 52. Accordingly, the number of component parts of the ink jet head 1 is reduced.

Furthermore, the PI tape 49, since it is formed of resin material, is deformed easily. Therefore, the PI tape 49 can be disposed within the head block 47 by making a change in the shape of the PI tape 49, regardless of the shape of the inside of the head block 47. This facilitates the PI tape 49 to be disposed within the head block 47.

Moreover, since one or more through holes 50 are formed in the PI tape 49, this makes it possible for the moisture absorbent 52 sealed within the first closed space 57a to effectively absorb moisture within the second closed space 57b through the through holes 50. Accordingly, dielectric breakdown due to moisture is prevented from occurring.

Furthermore, since the head block 47 is formed of stainless steel, this makes it possible to prevent entrance of water vapor into the closed space 57. Accordingly, dielectric breakdown due to moisture is prevented from occurring.

In addition, since the head block 47 is fixed to the upper surface of the nozzle plate 39, this eliminates the need for separate provision of a fixing means for fixing the head block 47 to the nozzle plate 39. Accordingly, the number of component parts of the ink jet head 1 is reduced.

Furthermore, since the nozzle plate 39 extends longer than the piezoelectric actuator 21 in the primary scan direction X as well as in the secondary scan direction Y, the head block 47 fixed to the four corners of the upper surface of the nozzle plate 39 will not come into contact with the piezoelectric actuator part 22. This accordingly prevents the head block 47 from interfering with the operation of the piezoelectric actuator part 22.

Moreover, since the head block 47 is mounted on a region of the upper surface of the head main body part 17 other than where the ink supply path 41 is provided, this ensures that replacement of an ink tank will not be impeded by the head block 47. This accordingly facilitates ink tank replacement.

In the present embodiment, the head block 47 is fixed to the upper surface of the nozzle plate 39 by the presser jig 55 through the first O-ring 51, the electrical interconnection 45, and the second O-ring 53. Alternatively, pins, screws, or the like may be used in place of the presser jig 55. In addition, a retaining jig, a pinching jig, an adhesive, or the like may be used instead of the presser jig 55 for fixing the head block 47 to the nozzle plate 39.

Figure 11:
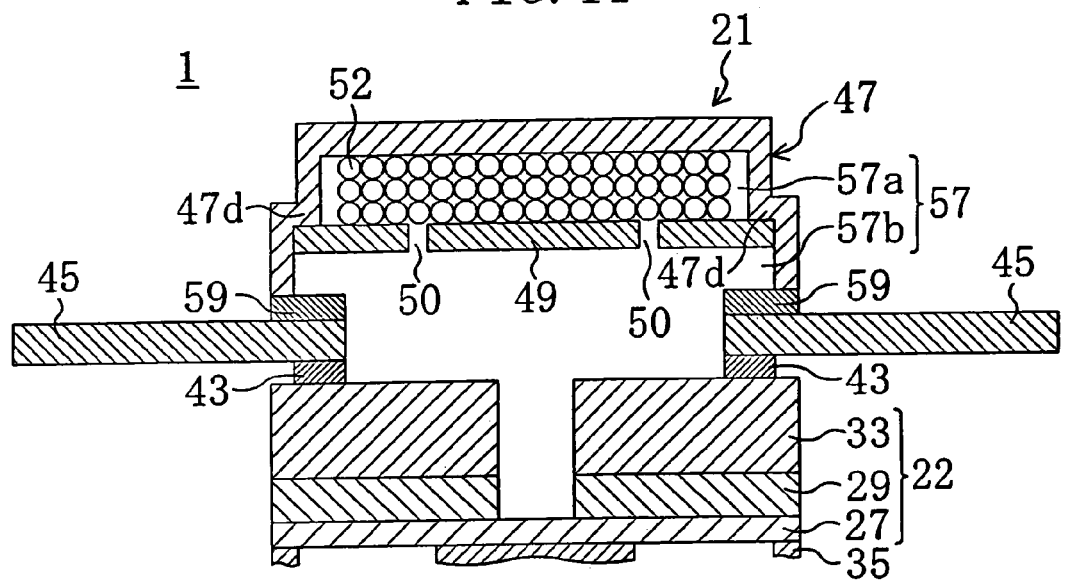
FIG. 11 is a cross-sectional view of a part of the ink jet head according to the embodiment.
Figure 12:
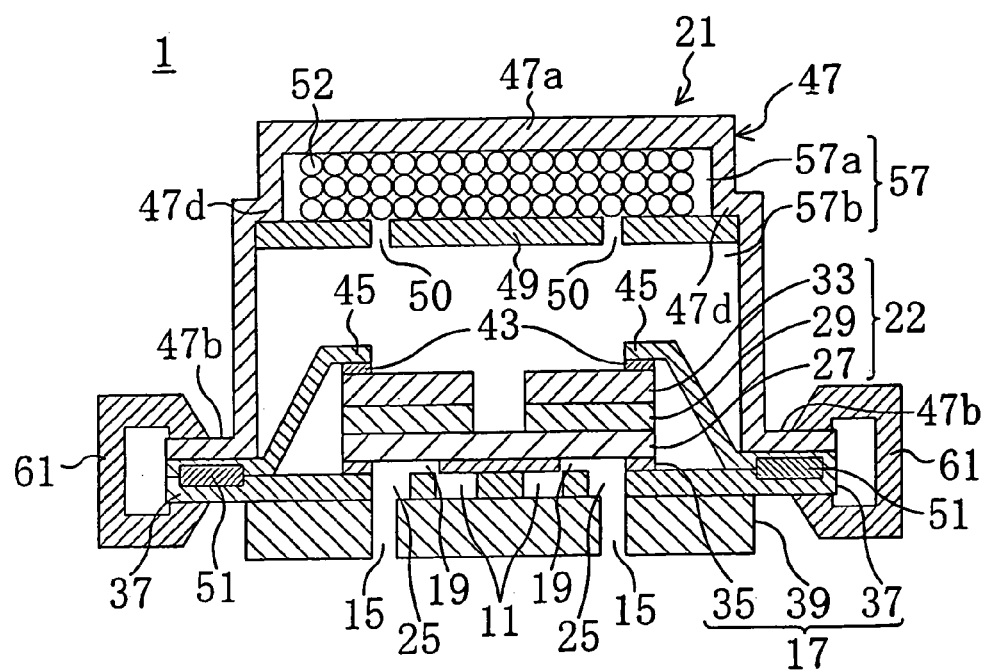
FIG. 12 is a cross-sectional view of the ink jet head according to the embodiment.

In the present embodiment, the head block 47 is fixed to the upper surface of the nozzle plate 39 by the presser jig 55, which is, however, not deemed restrictive. For example, as shown in FIG. 11, the head block 47 may be fixed to the electrical interconnection 45 formed on the individual electrode 33 by an adhesive 59. Furthermore, as shown in FIG. 12, the head block 47 and the ink flow path forming plate 37 are fixed by a presser jig 61. In this case, the ink flow path forming plate 37 extends longer than the piezoelectric actuator 21, the pressure chamber forming plate 35, and the nozzle plate 39 in the primary scan direction X as well as in the secondary scan direction Y.

Furthermore, in the present embodiment, the head block 47 is fixed to the upper surface of the nozzle plate 39 by the presser jig 55. Alternatively, the head block 47 may be fixed to a side surface of the nozzle plate 39.

Additionally, in the present embodiment, the nozzle plate 39 extends longer than the piezoelectric actuator 21, the pressure chamber forming plate 35, and ink flow path forming plate 37 in the primary scan direction X as well as in the secondary scan direction Y. However, the pressure chamber forming plate 35, the ink flow path forming plate 37, and the nozzle plate 39 may extend substantially the same length in the primary scan direction X as well as in the secondary scan direction Y. In this case, the head block 47 is fixed to the upper surface of the pressure chamber forming plate 35.

In the present embodiment, the head block 47 is formed of stainless steel. Alternatively, the head block 47 may be formed of resin material. In this case, preferably the resin material has a thickness of not less than 1 mm.

Embodiment 2

An ink jet head according to the present embodiment employs substantial the same construction as the ink jet head of the first embodiment. Hereinafter, constructional differences from the first embodiment will be described.

Figure 13:
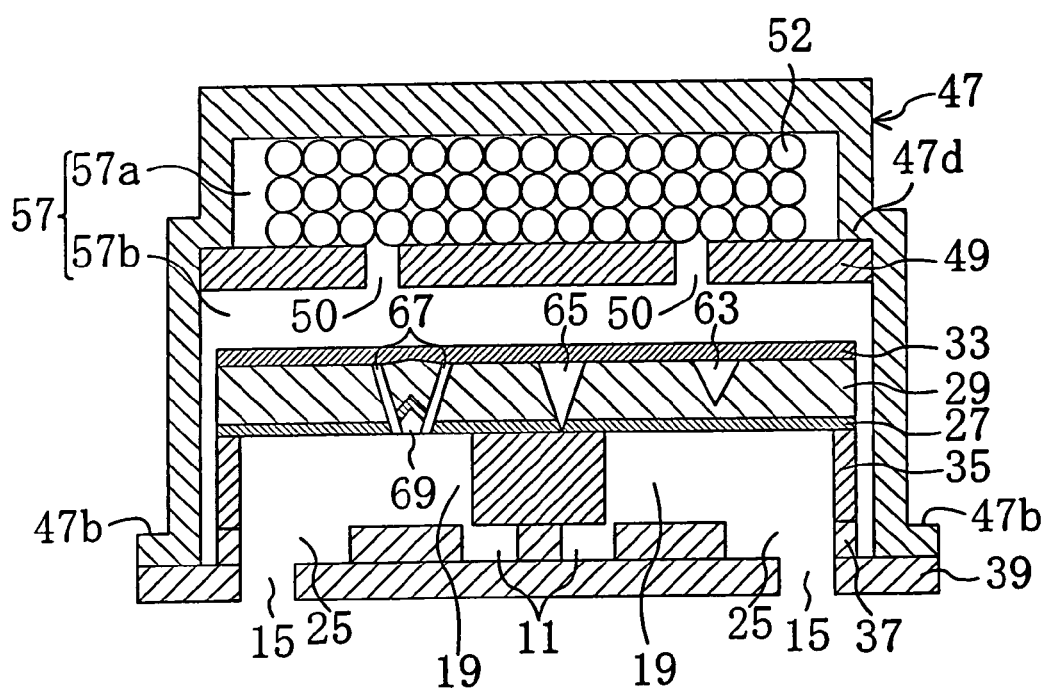
FIG. 13 is a cross-sectional view of an ink jet head according to an embodiment of the present invention.

In the present embodiment, the collar portion 47b of the head block 47 and an outer edge portion of the upper surface of the nozzle plate 39 are metal welded together, as shown in FIG. 13.

In the present embodiment, the collar portion 47b of the head block 47 and the upper surface outer edge portion of the nozzle plate 39 are metal welded together, thereby preventing entrance of water vapor into the closed space 57 from between the collar portion 47b of the head block 47 and the nozzle plate 39. Accordingly, dielectric breakdown due to moisture is prevented from occurring.

Additionally, in the present embodiment the collar portion 47b of the head block 47 and the upper surface outer edge portion of the nozzle plate 39 are metal welded together. Alternatively, it may be arranged such that the collar portion 47b of the head block 47 and the upper surface of the ink flow path forming plate 37 are metal welded. In this case, the metal-welded ink flow path forming plate 37 extends longer than the piezoelectric actuator 21, the pressure chamber forming plate 35, and the nozzle plate 39 in the primary scan direction X as well as in the secondary scan direction length Y. Furthermore, in the case the pressure chamber forming plate 35 is formed of metal, it may be arranged such that the collar portion 47b of the head block 47 and the upper surface of the pressure chamber forming plate 35 are metal welded together. In this case, the metal-welded pressure chamber forming plate 35 extends longer than the piezoelectric actuator 21, the ink flow path forming plate 37, and the nozzle plate 39 in the primary scan direction length X as well as in the secondary scan direction length Y.

Besides, in each of the foregoing embodiments the head block 47 is shaped like a hat. However, the head block 47 may assume any shape as long as it is able to enclose a surface of the piezoelectric actuator part 22 on the side of the individual electrode 33.

In addition to the above, each of the foregoing embodiments uses granulated silica gel as the moisture absorbent 52. Alternatively, the moisture absorbent 52 may be implemented by silica gel in the form of a sheet. Furthermore, moisture absorbents other than silica gel (e.g., alumina gel, calcium chloride, molecular sieve et cetera) may be used.

Additionally, in each of the foregoing embodiments the dividing member according to the present invention is formed by the PI tape 49 of resin. Alternatively the dividing member may be formed of resin materials other than the PI tape 49. Further, the dividing member may be formed of metal or the like. In this case, turn fasteners, push rivets, or the like for metal fixation within the head block 47 are used.

Furthermore, in each of the foregoing embodiments the common electrode 27 serves also as a vibrating plate. Alternatively, it may be arranged such that a vibrating plate is provided separately from the common electrode 27. In this case, the vibrating plate is formed on the pressure chamber forming plate 35, the individual electrode 33, or other component.

Additionally, in each of the foregoing embodiments the common electrode 27 is formed on the pressure chamber forming plate 35. Alternatively, it may be arranged such that the individual electrode 33 is formed on the pressure chamber forming plate 35. In this case, the common electrode 27 is formed on the piezoelectric element 29.

Furthermore, the components, i.e., the common electrode 27, the piezoelectric element 29, the individual electrode 33, the pressure chamber forming plate 35, the ink flow path forming plate 37, the nozzle plate 39 and so on, may differ in forming material and thickness from their counterparts of each of the foregoing embodiments.

Additionally, each of the foregoing embodiments forms the ink jet head 1 by employing the above-described forming method. Alternatively, other forming methods, e.g., a so-called transfer method, may be used to manufacture the ink jet head 1. A method of manufacturing the ink jet head 1 by means of a transfer technique will be described in brief. In the first place, an individual electrode, a piezoelectric element, and a vibrating plate are laminated, in that order, on an MgO substrate. In this case, either the vibrating plate may act also as a common electrode or a common electrode may be provided separately from the vibrating plate. This is followed by adhesion of a substrate in which a pressure chamber is formed onto the vibrating plate. Finally, the MgO substrate is removed.

Furthermore, in each of the foregoing embodiments the formation-completed ink jet head 1 is let stand in a low humidity environment for a certain period of time before being put in actual operation. Instead, the ink jet head 1 may be subjected to an air evacuating process under vacuum.

In addition to the above, in each of the foregoing embodiments one or more through holes 50 are formed through the PI tape 49; however, the provision of through holes may be unnecessary.

Furthermore, the ink jet head 1 according to each of the foregoing embodiments has two rows of pressure chamber recessed portions. Alternatively, the number of pressure chamber recessed portion rows may be one or not less than three. Additionally, the number of pressure chamber recessed portions 13 constituting a pressure chamber recessed portion row is arbitrary.

Additionally, in each of the foregoing embodiments, the PI tape 49 is disposed in the step portion 47d of the head block 47. The PI tape 49 may be disposed anywhere within the head block 47 as long as it will not come into contact with the piezoelectric actuator part 22.

INDUSTRIAL APPLICABILITY

As has been described above, the present invention is useful when applied to a printer for computers, facsimile machines, copying machines, et cetera.

The entire content of Priority Document No. 2002-181402 is incorporated herein by reference.

What is claimed is:

1. A piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture,
   wherein ambient relative humidity within said closed space is not less than 0% nor more than 20% in a measurement environment of 60° C. and 1 atm, and
   said cap member is fixed onto a surface of said piezoelectric actuator main body.

2. A piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture,
   wherein said cap member has, in an interior surface thereof, a water vapor permeability of not more than 7 $g/m^2 \cdot 24$ hr·atm, and
   said cap member is fixed onto a surface of said piezoelectric actuator main body.

3. The piezoelectric actuator of claim 1 further comprising an electrode interconnection, formed on said top electrode, for transmission of electrical signals to said top electrode, wherein said electrode interconnection is interposed between said cap member and a surface of said piezoelectric actuator main body.

4. The piezoelectric actuator of claim 2 further comprising an electrode interconnection, formed on said top electrode, for transmission of electrical signals to said top electrode, wherein said electrode interconnection is interposed between said cap member and a surface of said piezoelectric actuator main body.

5. An ink jet head comprising:
a piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture, and
an ink flow path forming member formed on a lower surface of said bottom electrode and having an ink flow path therein,
wherein ambient relative humidity within said closed space is not less than 0% nor more than 20% in a measurement environment of 60° C. and 1 atm,
a step portion is formed in an upper peripheral area of said ink flow path forming member,
said cap member fits with said step portion of said ink flow path forming member, and
said cap member is fixed onto a surface of said ink flow path forming member.

6. An ink jet head comprising:
a piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture, and
an ink flow path forming member formed on a lower surface of said bottom electrode and having an ink flow path therein,
wherein said cap member has, in an interior surface thereof, a water vapor permeability of not more than 7 g/m$^2$·24 hr·atm,
a step portion is formed in an upper peripheral area of said ink flow path forming member,
said cap member fits with said step portion of said ink flow path forming member, and
said cap member is fixed onto a surface of said ink flow path forming member.

7. An ink jet head comprising;
a piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture, and
a metallic ink flow path forming member formed on a lower surface of said bottom electrode and having an ink flow path therein,
wherein:
ambient relative humidity within said closed space is not less than 0% nor more than 20% in a measurement environment of 60° C. and 1 atm,
said cap member is formed of a metal,
a step portion is formed in an upper peripheral area of said ink flow path forming member, and
said cap member is joined, by welding, to said step portion of said ink flow path forming member.

8. An ink jet head comprising:
a piezoelectric actuator comprising:
   a piezoelectric actuator main body having a bottom electrode, a piezoelectric element formed on said bottom electrode, and a top electrode, formed on said piezoelectric element, for impressing voltage on said piezoelectric element together with said bottom electrode,
   a cap member for enclosing at least a surface of said piezoelectric actuator main body on the side of said top electrode, and
   a moisture absorbent disposed in a closed space between said piezoelectric actuator main body and said cap member and having an ability to absorb moisture, and
a metallic ink flow path forming member formed on a lower surface of said bottom electrode and having an ink flow oath therein,
wherein:
said cap member has, in an interior surface thereof, a water vapor permeability of not more than 7 g/m$^2$·24 hr·atm,
said cap member is formed of a metal,
a step portion is formed in an upper peripheral area of said ink flow path forming member, and
said cap member is joined, by welding, to said step portion of said ink flow path forming member.

* * * * *

UNITED STATES PATENT AND TRADEMARK OFFICE
CERTIFICATE OF CORRECTION

| | |
|---|---|
| PATENT NO. | : 7,196,456 B2 |
| APPLICATION NO. | : 11/150576 |
| DATED | : March 27, 2007 |
| INVENTOR(S) | : Takanori Nakano et al. |

Page 1 of 1

It is certified that error appears in the above-identified patent and that said Letters Patent is hereby corrected as shown below:

<u>Column 22</u>

Line 49, Claim 8, "oath" should be -- path --

Signed and Sealed this

Third Day of July, 2007

JON W. DUDAS
*Director of the United States Patent and Trademark Office*